US008354867B2

(12) United States Patent
Lu et al.

(10) Patent No.: US 8,354,867 B2
(45) Date of Patent: Jan. 15, 2013

(54) PHASE-LOCKED LOOP CIRCUIT AND AN ASSOCIATED METHOD (75) Inventors: Shey-Shi Lu, Taipei (TW); Hsien-Ku Chen, Taipei (TW)

(73) Assignee: National Taiwan University, Taipei (TW)

(*) Notice: Subject to any disclaimer, the term of this patent is extended or adjusted under 35 U.S.C. 154(b) by 296 days.

(21) Appl. No.: 12/718,291

(22) Filed: Mar. 5, 2010

(65) Prior Publication Data

US 2010/0225368 A1    Sep. 9, 2010

(30) Foreign Application Priority Data

Mar. 6, 2009   (TW) .............................. 98107231 A (51) Int. Cl.
H03D 9/00       (2006.01)
G01R 25/00      (2006.01)
H03L 7/06       (2006.01)
H03L 7/00       (2006.01)

(52) U.S. Cl. .................... 327/156; 327/2; 327/3; 327/5; 327/7; 327/39; 327/40; 327/41; 327/42; 327/43; 327/157; 327/158; 327/159; 327/162; 327/163; 327/243; 327/244

(58) Field of Classification Search .................. 327/2, 3, 327/5, 7, 156–159, 162, 163, 205, 243, 244
See application file for complete search history.

(56) References Cited

U.S. PATENT DOCUMENTS

| 5,220,201 | A  | * | 6/1993  | Kawasaki et al. ............. 327/156 |
| 5,245,223 | A  | * | 9/1993  | Lim et al. ......................... 327/80 |
| 6,937,073 | B2 | * | 8/2005  | Dally et al. ................... 327/116 |
| 7,068,111 | B2 |   | 6/2006  | Lee |
| 7,266,172 | B2 | * | 9/2007  | Hairapetian et al. .......... 375/376 |
| 7,295,824 | B2 |   | 11/2007 | Kluge et al. |
| 7,528,638 | B2 | * | 5/2009  | Lee et al. ...................... 327/158 |
| 2005/0134337 | A1 | | 6/2005 | Lee et al. |
| 2008/0061838 | A1 | * | 3/2008 | Wang et al. ....................... 327/3 |
| 2009/0033381 | A1 | * | 2/2009 | Lee et al. ...................... 327/156 |

OTHER PUBLICATIONS

Intellectual Property Office, Ministry of Economic Affairs, R.O.C., "Office Action", Oct. 15, 2012, Taiwan.

* cited by examiner

*Primary Examiner* — Lincoln Donovan
*Assistant Examiner* — Colleen O Toole
(74) *Attorney, Agent, or Firm* — Morris Manning & Martin LLP; Tim Tingkang Xia, Esq.

(57) ABSTRACT

The present invention relates to a PLL circuit and an associated method that allows the PLL circuit to operate at a higher operating frequency with a wider bandwidth and a better out-band noise suppression. The PLL circuit comprises a delay locked loop (DLL), a phase-frequency detector (PFD), a loop filter, a voltage controlled oscillator (VCO) and a frequency divider.

11 Claims, 9 Drawing Sheets

PHASE-LOCKED LOOP CIRCUIT AND AN ASSOCIATED METHOD

FIELD OF THE INVENTION

The present invention relates to a phase-locked loop circuit and an associated method. More specifically, the present invention is directed to a phase-locked loop circuit, which can operate at higher frequencies with a broader bandwidth and a better out-band noise suppression.

BACKGROUND OF THE INVENTION

The wavelength of a millimeter wave varies from 10 millimeters to 1 millimeter and the frequency in use may range from 30 GHz to 300 GHz. The characteristics of the millimeter waves, such as anti-interference and anti-interception, make millimeter waves preferable for high data-rate wireless communication. In the millimeter wave communication system, a phase locked loop is an important component, which generates a stable signal at for frequency conversions. By comparing the phase of the signal generated by PLL its own with the phase of another signal from an external source at low frequency, a PLL can adjust the output signal and provide a carrier with high purity at high frequency range.

Figure 1:
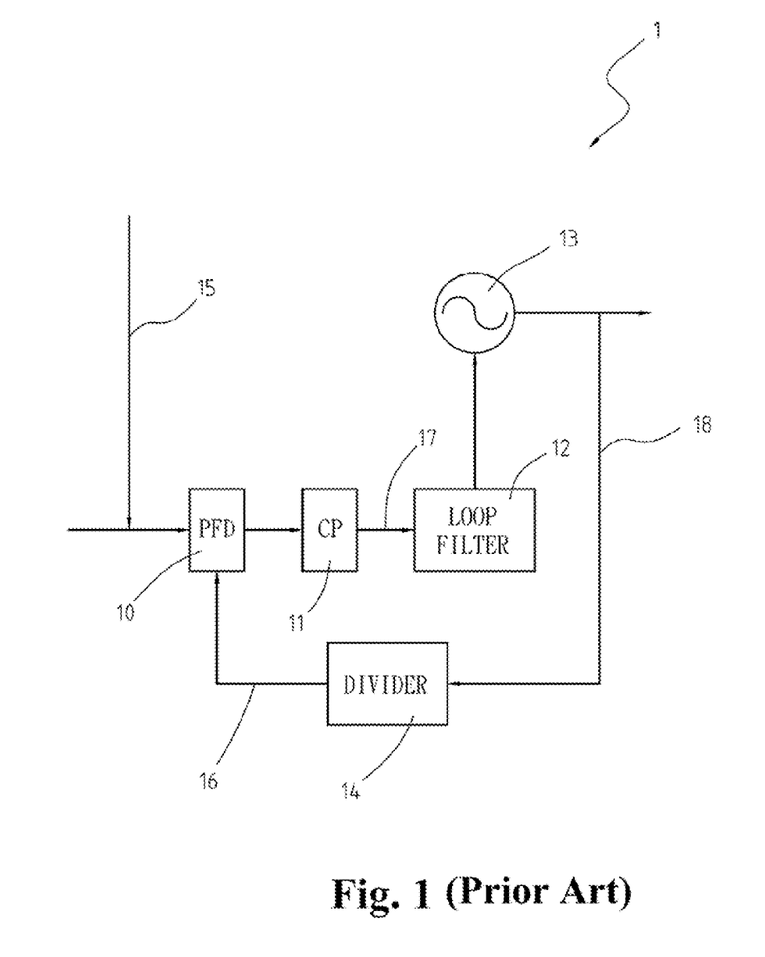
FIG. 1 is a block diagram of a conventional phase-locked loop (PLL) circuit.

With reference to FIG. 1, a conventional PLL comprises a phase-frequency detector (PFD) (10), a charge pump (11), a loop filter (12), a voltage controlled oscillator (VCO) (13) and a frequency divider (14).

The PFD (10) detects the phase difference between a reference signal (15) and a feedback signal (16).

The charge pump (11) is connected to the PFD (10) and generates a control voltage (17) based on the phase difference between the reference signal (15) and the feedback signal (16).

The loop filter is a low-pass filter that filters out high frequency components of the control voltage (17), which is connected to the charge pump (11).

The VCO (13) generates an oscillating signal (18) based on the control voltage (17).

The frequency divider (14) divides frequency of the oscillating signal (18) into the frequency that the reference signal (15) oscillates at. The divided signal at the output of the frequency divider is the feedback signal (16). The feedback signal (16) is further input to the PFD (10).

Since the oscillation frequency for millimeter wave applications is higher than 30 GHz and the frequency of the reference signal (15) is 200 MHz generated by a crystal oscillator, the division ratio is more than 150.

It is known that the phase noise within the loop bandwidth is dominated by the reference signal (15) and increasing the loop bandwidth can suppress the phase noise contributed by VCO (13). However, if the loop bandwidth is close to the frequency of reference signal, reference spurs may appear in each side band of the desired signal at the output of the PLL with an offset value of the reference frequency. As a rule-of-thumb, the loop bandwidth of a PLL is generally designed around 1/10 frequency of reference signal (15). Therefore in theory, the higher the frequency of the reference signal is, the wider loop bandwidth and the better phase noise of the PLL will be. Unfortunately, there is another constraint to the loop bandwidth of a PLL, which is the upper limit of the operation frequency of the PFD.

Figure 2:
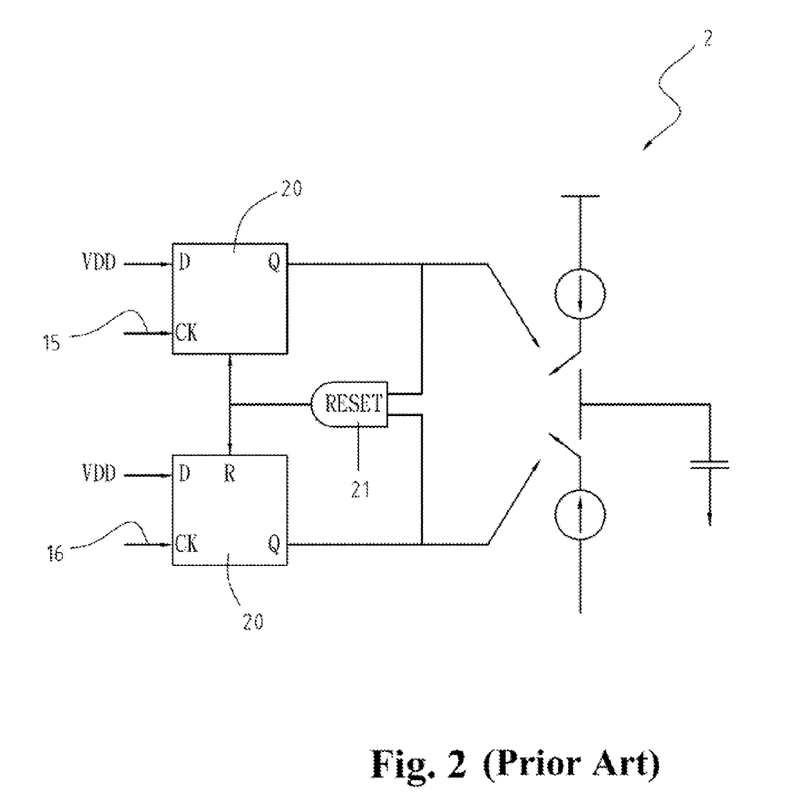
FIG. 2 is a conventional tri-state phase frequency detector (PFD) used in the PLL circuit in FIG. 1.

A conventional tri-state PFD (2) comprises an AND logic gate (21) and two D Flip-Flops (DFF) (20) as is shown in FIG. 2.

The DFFs (20) respectively receive a reference signal (25) and a feedback signal (26).

The AND logic gate (21) is connected to the DFFs (20). When the phases of the reference signal (25) and the feedback signal (26) are matched (synchronized), the AND logic gate (21) will reset the DFFs (20).

A drawback of such conventional tri-state PFD (2) is its operating frequency limited by the DFFs (20). If the frequencies of the reference signal (25) and the feedback signal (26) are higher than the operating frequency of the DFFs (20), unpredictable errors may occur, which limits the frequency of reference signal as well as the operation frequency of the PFD.

Figure 3:
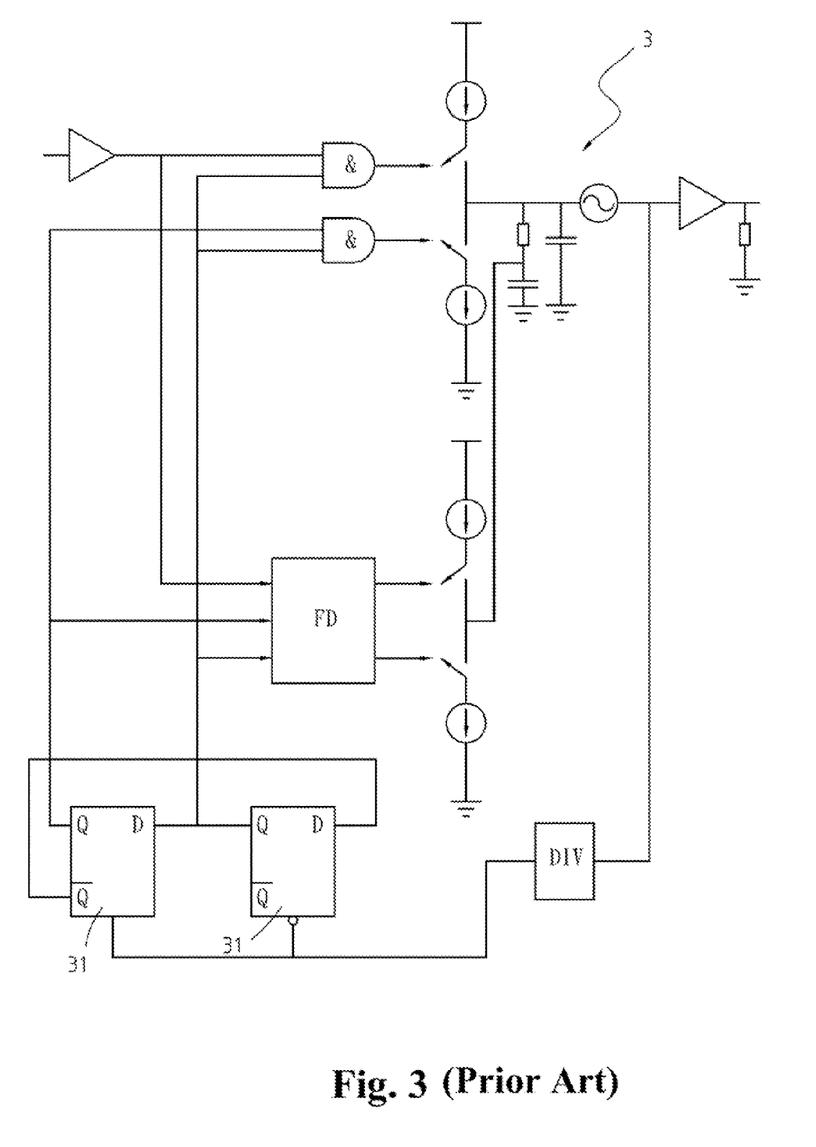
FIG. 3 is an another conventional phase-frequency detector (PFD) used in the PLL circuit in FIG. 1.

Another kind of conventional PFD (3) is proposed to resolve the issue of conventional tri-state PFD (2) as shown in FIG. 3, which comprises only one D Flip-Flop (DFF) (31) and no reset path. The DFF (31) of this PFD (3) is used to delay the phase of a reference signal (32) by 90 degrees. Nevertheless, the dependence on such 90 degree phase delay makes the design of DFF more complicated when the frequency of reference signal is increased, which also constrains operation frequency of PFD.

To resolve the issues about the limited loop bandwidth of conventional PFDs, a PFD capable to handle high frequency reference signal is proposed, which can provide the PLL with a wider loop bandwidth and a better out-band noise suppression.

SUMMARY OF THE INVENTION

The first objective of the present invention is to provide a phase-locked loop (PLL) circuit to increase the frequency of a reference signal by adding a delay locked loop (DLL) and to reduce its out-band noise.

The second objective of the present invention is to provide a phase-frequency detector (PFD) of the PLL circuit to detect the voltage difference between a reference signal and a feedback signal, which enable a wider loop bandwidth and better phase noise suppression.

The present invention relates to a PLL circuit and an associated method that allows the PLL circuit to operate at higher operating frequency with a wider bandwidth and a better out-band noise suppression. The PLL circuit comprises a delay locked loop (DLL), a phase-frequency detector (PFD), a loop filter, a voltage controlled oscillator (VCO) and a frequency divider.

DETAILED DESCRIPTION OF THE PRESENT INVENTION

Figure 4:
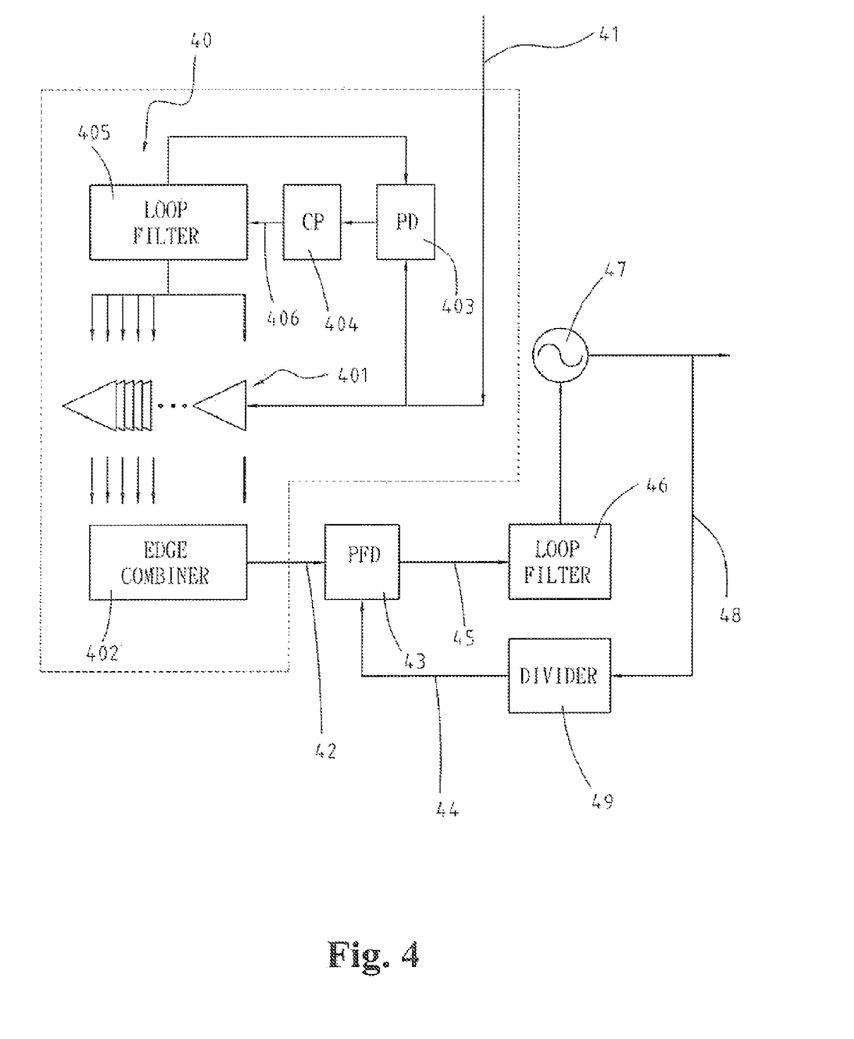
FIG. 4 is a block diagram of a phase-locked loop (PLL) circuit in accordance with the present invention.

With reference to FIG. 4, a phase-locked loop (PLL) circuit in accordance with the present invention extends the loop bandwidth and suppresses the out-band noise, which comprises a delay locked loop (DLL) (40), a phase-frequency detector (PFD) (43), a loop filter (46), a voltage controlled oscillator (VCO) (47) and a frequency divider (49).

The DLL (40) receives a clock signal (41) and generates a reference signal (42) based on the clock signal (41). The reference signal (42) is a sine wave. The DLL (40) comprises multiple delay cells (401), a synchronizing phase detector (403), a synchronizing charge pump (404), a synchronizing loop filter (405) and an edge combiner (402).

The delay cells (401) receive the clock signal (41) and output a delayed clock signal (41).

The synchronizing phase detector (403) determines the synchronization of the delayed and non-delayed clock signal (41).

The synchronizing charge pump (404) is connected to the synchronizing phase detector (403) and generates a synchronizing control voltage (406) based on the determination of the synchronizing phase detector (403).

The synchronizing loop filter (405) is a low-pass filter and is connected to the synchronizing charge pump (404) and the delay cells (401). The synchronizing loop filter (405) filters out high frequency components of the synchronizing control voltage (406) and transmits the filtered synchronizing control voltage (406) to adjust the delay of the delay cells (401) that insures the synchronization of the delayed and non-delayed clock signal (41).

The edge combiner (402) extracts both a delayed and non-delayed clock signals (41), and then generates the reference signal (42) based on the difference of the extracted delayed and non-delayed clock signals (41).

Figure 5:
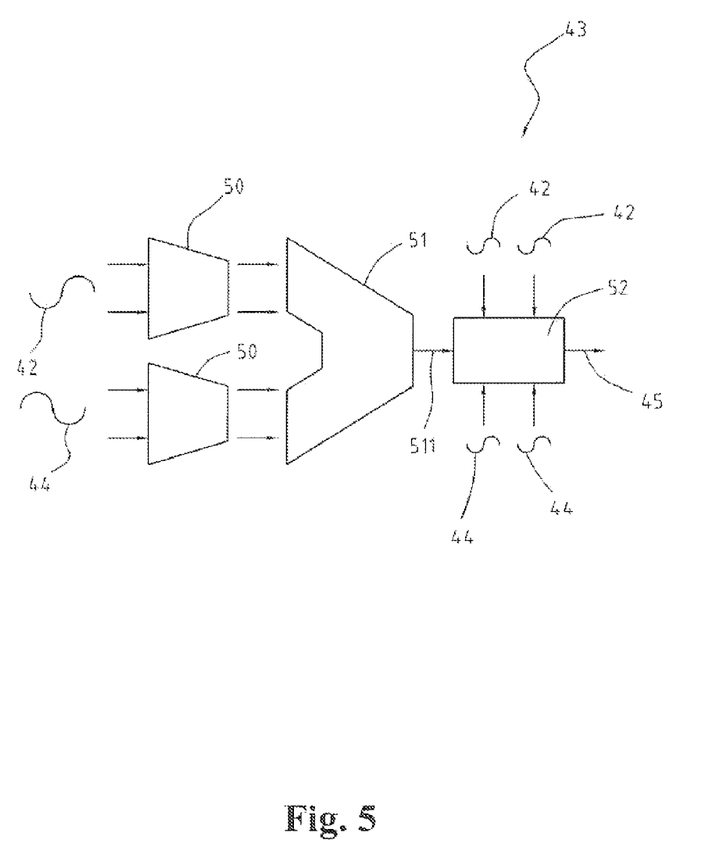
FIG. 5 is a block diagram of a phase-frequency detector (PFD) used in the PLL circuit in FIG. 4.

The PFD (43) receives the reference signal (42) and a feedback signal (44), which generates a control voltage (45) based on the difference between the received reference signal (42) and the feedback signal (44). The PFD (43) is connected to the edge combiner (402) and comprises two hysteresis buffers (50), a dominator (51) and a voltage to current converter (V-I converter) (52).

The reference signal (42) and a feedback signal (44) are sinusoidal waves that comprise an in-phase component and an out-of-phase component.

Figure 6:
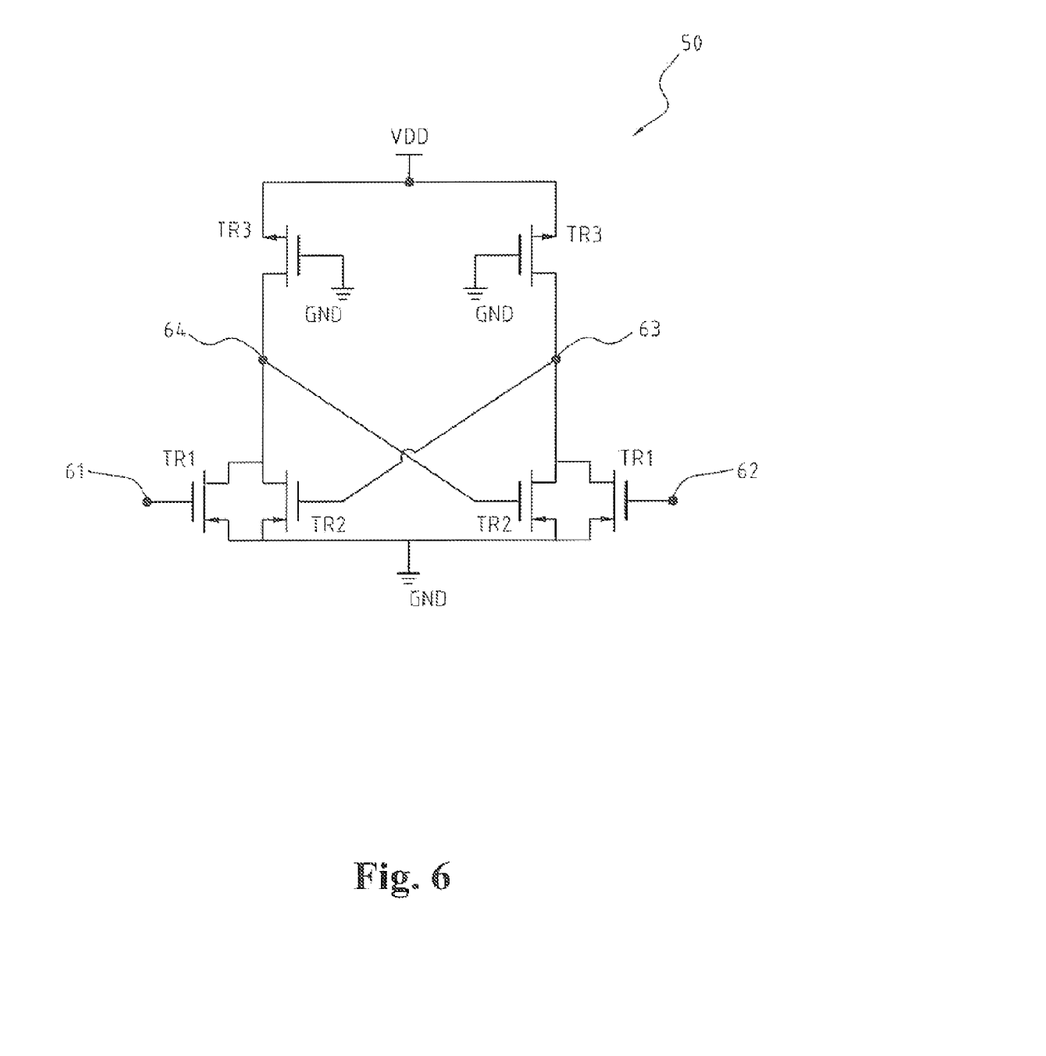
FIG. 6 is a circuit diagram of a hysteresis buffer of the PFD in accordance with the present invention.

With further reference to FIGS. 5 and 6, the hysteresis buffers (50) are rail-to-rail circuit structured waveform processors (50) that respectively receive the reference signal (42) and the feedback signal (44) and then convert the reference signal (42) and the feedback signal (44) to square waves.

Each hysteresis buffer (50) may be implemented with a voltage source (VDD), multiple grounds (GND), an in-phase input terminal (61), an out-of-phase input terminal (62), an in-phase output terminal (63), an out-of-phase output terminal (64), a pair of input transistors (TR1), a pair of first transistors (TR3) and a pair of second transistors (TR2).

The in-phase input terminal (61) receives the in-phase component of the reference signal (42) or the feedback signal (44).

The out-of-phase input terminal (62) receives the out-of-phase component of the reference signal (42) or the feedback signal (44).

Each input transistor (TR1) comprises a gate, a source and a drain. The gates of the input transistors (TR1) are connected respectively to the in-phase input terminal (61) and the out-of-phase input terminal (62). The sources of the input transistors (TR1) are connected to ground (GND).

Each first transistor (TR3) comprises a source, a gate and a drain. The sources of the first transistors (TR3) are connected to the voltage source (VDD). The gates of the first transistors (TR3) are connected to ground (GND). The drains of the first transistors (TR3) are connected respectively to the in-phase output terminal (63) and the out-of-phase output terminal (64).

Each second transistor (TR2) comprises a drain, a source and a gate. The drains of the second transistors (TR2) are connected respectively to the drains of the first transistors (TR3) and respectively to the corresponding in-phase output terminal (63) and out-of-phase output terminal (64). The sources of the second transistors (TR2) are connected to ground (GND). The gates of the second transistors (TR2) are connected respectively to drains of the opposite first transistors (TR3).

Figure 7:
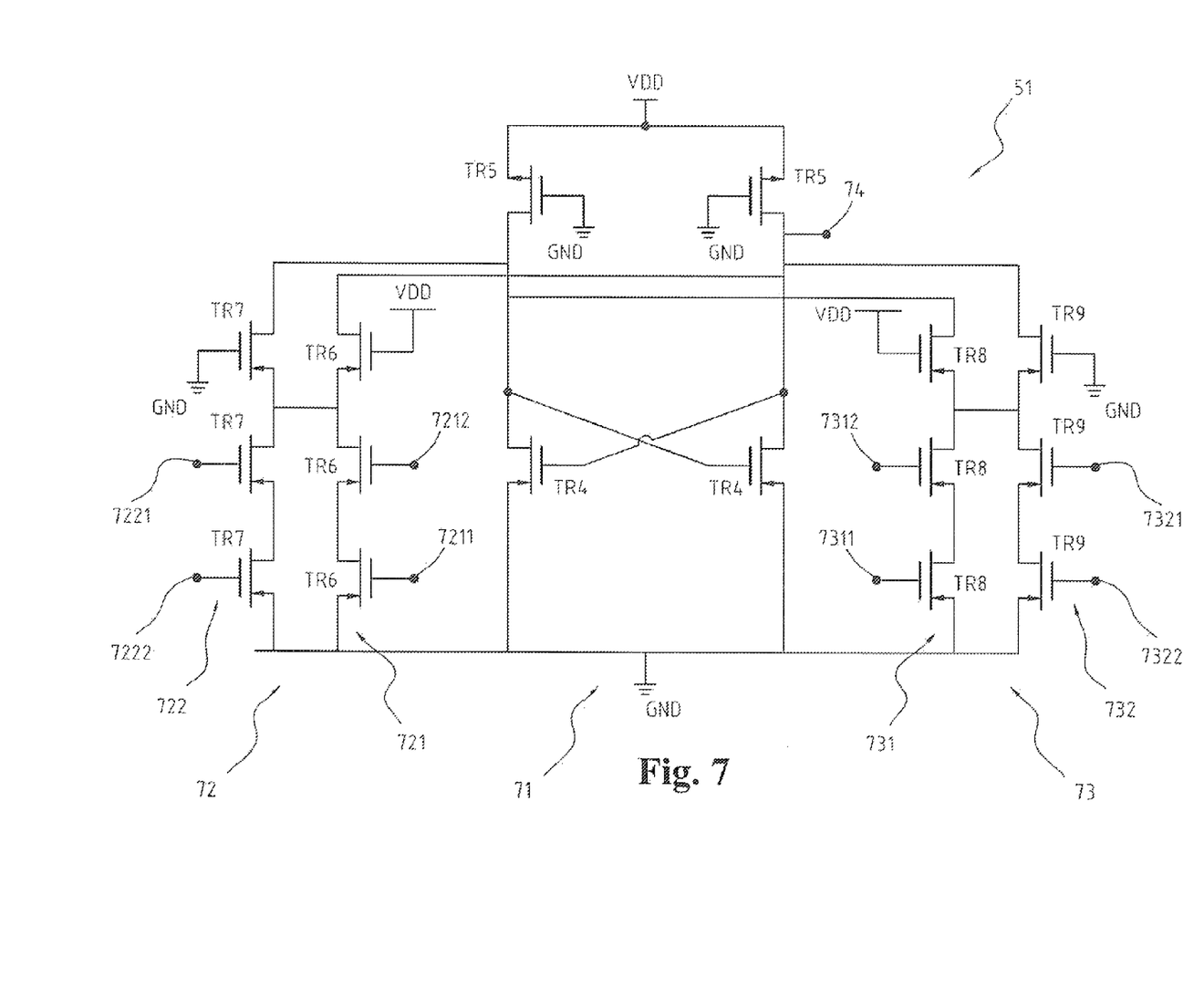
FIG. 7 is a circuit diagram of a dominator of the PFD in accordance with the present invention.

With further reference to FIG. 7, the dominator (51) generates a dominant signal (511) based on the reference signal (42) and the feedback signal (44) from the hysteresis buffers (50). The dominator (51) may be implemented with a voltage source (VDD), a ground (GND), a primary rail pair (71), a dominant output terminal (74), an in-phase double rail (72) and an out-of-phase double rail (73).

The primary rail pair (71) is connected to the voltage source (VDD) and the ground (GND), which comprises a pair of third transistors (TR4) and a pair of forth transistors (TR5).

Each third transistor (TR4) comprises a source, a gate and a drain. The sources of the third transistors (TR4) are connected to ground (GND). The drains of the third transistors (TR4) are connected respectively to gates of the opposite third transistors (TR4).

Each forth transistor (TR5) comprises a source, a gate and a drain. The gates of the forth transistors (TR5) are connected to ground (GND). The sources of the forth transistors (TR5) are connected to the voltage source (VDD). The drains of the forth transistors (TR5) are connected respectively to the drains of the corresponding third transistors (TR4).

The dominant output terminal (74) is connected to the primary rail pair (71) and outputs the dominant signal (511).

The in-phase double rail pair (72) comprises a forward rail (721) and a backward rail (722).

The forward rail (721) has two ends and comprises a voltage source (VDD), an in-phase reference input terminal (7211), an in-phase feedback input terminal (7212) and three transistors (TR6). One end of the forward rail (721) is connected to the dominant output terminal (74) and the primary rail (71), and the other end is connected to the ground (GND).

The in-phase reference input terminal (7211) receives the in-phase component of the reference signal (42) from the hysteresis buffers (50).

The in-phase feedback input terminal (7212) receives the in-phase component of the feedback signal (44) from the hysteresis buffers (50).

The transistors (TR6) are connected in series and each transistor (TR6) comprises a gate, a source and a drain. The gates of the transistors (TR6) are connected respectively to the voltage source (VDD), the in-phase reference input (7211) and the in-phase feedback input (7212).

The backward rail (722) has two ends and comprises a ground (GND), an in-phase reference input (7221), an in-phase feedback input (7222) and three transistors (TR7). The ends of the backward rail (722) are connected respectively to the corresponding primary rail (71) and ground (GND).

The in-phase reference input terminal (7221) receives the in-phase component of the reference signal (42) from the hysteresis buffers (50).

The in-phase feedback input terminal (7222) receives the in-phase component of the feedback signal (44) from the hysteresis buffers (50).

The transistors (TR7) are connected in series and each transistor (TR7) comprises a gate, a source and a drain. The gates of the transistors (TR7) are connected respectively to ground (GND), the in-phase reference input terminal (7221) and the in-phase feedback input terminal (7222). The source of the transistor (TR7) with the gate connected to ground (GND) is connected to the source of the corresponding transistor (TR6) in the forward rail (721). The source of another transistor (TR6) is connected to ground The out-of-phase double rail (73) comprises a forward rail (731) and a backward rail (732).

The forward rail (731) has two ends and comprises a voltage source (VDD), an out-of-phase reference input terminal (7311), an out-of-phase feedback input terminal (7312) and three transistors (TR8). One of the ends in the forward rail (731) is connected to another forward rail (721) of the in-phase double rail (72) and the other end connected to ground (GND).

The out-of-phase reference input terminal (7311) receives the out-of-phase component of the reference signal (42) from the hysteresis buffers 50).

The out-of-phase feedback input terminal (7312) receives the out-of-phase component of the feedback signal (44) from the hysteresis buffers (50).

The transistors (TR8) are connected in series and each transistor (TR8) comprises a source, a drain and a gate. The gates of the transistors (TR8) are connected respectively to the voltage source (VDD), the out-of-phase reference input terminal (7311) and the out-of-phase feedback input terminal (7312).

The backward rail (732) has two ends and comprises a ground (GND), an out-of-phase reference input terminal (7321), an out-of-phase feedback input terminal (7322) and three transistors (TR9). The ends of the backward rail (732) are connected respectively to the corresponding primary rail (71) and ground (GND).

The out-of-phase reference input terminal (7221) receives the out-of-phase component of the reference signal (42) from the hysteresis buffers (50).

The out-of-phase feedback input terminal (7222) receives the out-of-phase component of the feedback signal (44) from the hysteresis buffers (50).

The transistors (TR9) are connected in series and each transistor (TR9) comprises a gate, a source and a drain. The gates of the transistors (TR9) are connected respectively to ground (GND), the out-of-phase reference input the (7321) and the out-of-phase feedback input the (7222). The source of the transistor (TR9) with the gate connected to ground (GND) is connected to the source of the transistor (TR8) in the forward rail (731) with the gate connected to the voltage source (VDD).

When the dominator (51) receives a high voltage potential of the reference signal (42) and the feedback signal (44), a current will flow from the voltage source (VDD) through the dominant output terminal (74) to ground (GND), and the dominator (51) generates a low voltage potential of the dominant signal (511).

When the dominator (51) receives a low voltage potential of the reference signal (42) and the feedback signal (44), a current will flow from ground (GND) through the dominant output terminal (74) to the voltage source (VDD), and the dominator (51) generates a high potential voltage of the dominant signal (511).

Figure 8:
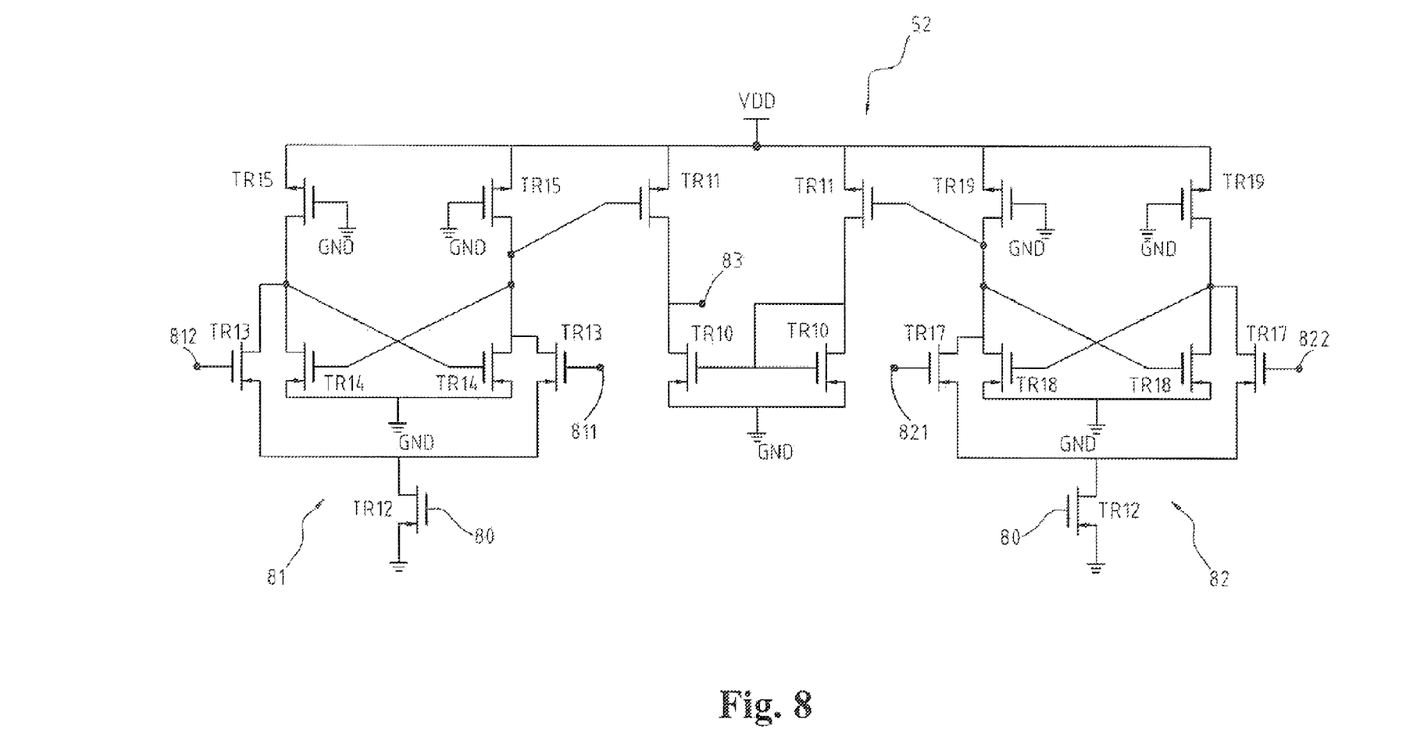
FIG. 8 is a voltage to current converter (V-I converter) of the PFD in accordance with the present invention.

With further reference to FIG. 8, the V-I converter (52) is driven by the dominant signal (511) and generates the control voltage (45) based on the voltage potential of the dominant signal (511) and the frequencies of the reference signal (42) and the feedback signal (44). The control voltage (45) can be a pull-up control signal or a pull-down control signal accordingly.

The pull-up control signal increases the oscillating frequency of the VCO (47).

The pull-down control signal decreases the oscillating frequency of the VCO (47).

The V-I converter (52) may be implemented with a voltage source (VDD), a ground (GND), a dominant input terminal (80), an output terminal (83), two fifth transistors (TR10), two sixth transistors (TR11), a first register (81) and a second register (82).

The dominant input terminal (80) receives the dominant signal (511) from the dominator (51).

Each fifth transistor (TR10) comprises a gate, a source and a drain. The gates of the fifth transistors (TR10) are connected respectively to the gates of the other fifth transistors (TR10). The sources of the fifth transistors (TR10) are connected to ground (GND). The drain of one fifth transistor (TR10) is connected to the gates of the fifth transistors (TR10). The drain of the other fifth transistor (TR10) is connected to the output terminal (83).

Each sixth transistor (TR11) comprises a gate, a drain and a source. The drain of one of the sixth transistors (TR11) is connected to the drain of the corresponding fifth transistor (TR10) and the output terminal (83). The drain of the other sixth transistor (TR11) is connected to the drain of the other fifth transistor (TR10) and the gates of the fifth transistors (TR10). The source of the sixth transistor (TR11) is connected to the voltage source (VDD). The source of the sixth transistor (TR11) is connected to the source voltage (VDD).

The first register (81) is connected to the dominant input terminal (80), the gate of the corresponding sixth transistor (TR11) and the source voltage (VDD), which receives the dominant signal (511), the in-phase component of the reference signal (42) and the out-of-phase component of the reference signal (42). The first register (81) comprises an out-of-phase reference signal input terminal (812), an in-phase reference signal input terminal (811), multiple grounds (GND), an input transistor (TR12), a pair of seventh transistors (TR13), a pair of eighth transistors (TR14) and a pair of ninth transistors (TR15).

The out-of-phase reference signal input terminal (812) receives the out-of-phase component of the reference signal (42) from the hysteresis buffers (50).

The in-phase reference signal input terminal (811) receives the in-phase component of the reference signal (42) from the hysteresis buffers (50).

The input transistor (TR12) connects to the dominant input terminal (80) and comprises a gate, a source and a drain. The gate of the input transistor (TR12) is connected to the dominant input terminal (80). The source of the input transistor (TR12) is connected to ground (GND).

Each seventh transistor (TR13) comprises a source, a drain and a gate. The sources of the seventh transistors (TR13) are connected to each other and the drain of the input transistor (TR12). The gates of the seventh transistors (TR13) are connected respectively to the out-of-phase input terminal (812) and the in-phase input (811) terminal.

Each eighth transistor (TR14) comprises a gate, a source and a drain. The gates of the eighth transistors (TR14) are connected respectively to the drains of the opposite seventh transistors (TR13). The sources of the eighth transistors (TR14) are connected to ground (GND). The drains of the eighth transistors (TR14) are connected respectively to the gates of the other eighth transistors (TR14).

Each ninth transistor (TR15) comprises a gate, a source and a drain. The gates of the ninth transistors (TR15) are connected to ground (GND). The sources of the ninth transistors (TR15) are connected to the voltage source (VDD). The drains of the ninth transistors (TR15) are connected to the drains of the corresponding seventh and eighth transistors (TR13, TR14). The drain of one ninth transistor (TR15) is further connected to the gate of the sixth transistor (TR11) corresponding to the first register (81).

The second register (82) is connected to the dominant input terminal (80), the gate of the sixth transistor (TR11) and the source voltage (VDD), which receives the dominant signal (511), the in-phase component of the feedback signal (44) and the out-of-phase component of the feedback signal (44). The second register (82) comprises an out-of-phase feedback signal input terminal (822), an in-phase feedback signal input terminal (821), multiple grounds (GND), an input transistor (TR12), a pair of tenth transistors (TR17), a pair of eleventh transistors (TR18) and a pair of twelfth transistors (TR19).

The out-of-phase feedback signal input terminal (822) receives the out-of-phase component of the feedback signal (42) from the hysteresis buffers (50).

The in-phase feedback signal input terminal (821) receives the in-phase component of the feedback signal (42) from the hysteresis buffers (50).

The input transistor (TR12) connects to the dominant input terminal (80) and comprises a gate, a source and a drain. The gate of the input transistor (TR12) is connected to the dominant input terminal (80). The source of the input transistor (TR12) is connected to ground (GND).

Each tenth transistor (TR17) comprises a source, a drain and a gate. The sources of the tenth transistors (TR17) are connected to each other and also the drain of the input transistor (TR12). The gates of the tenth transistors (TR17) are connected respectively to the out-of-phase feedback signal input terminal (822) and the in-phase feedback signal input terminal (821).

Each eleventh transistor (TR18) comprises a gate, a source and a drain. The gates of the eleventh transistors (TR18) are connected respectively to the drains of the opposite eleventh transistors (TR13). The sources of the eleventh transistors (TR13) are connected to ground (GND). The drains of the eleventh transistors (TR18) are connected respectively to the gate of the other eleventh transistors (TR18).

Each twelfth transistor (TR19) comprises a gate, a source and a drain. The gates of the twelfth transistor (TR19) are connected to ground (GND). The sources of the twelfth transistors (TR19) are connected to the voltage source (VDD). The drains of the twelfth transistors (TR19) are connected to the drains of the corresponding tenth and eleventh transistors (TR17, TR18). The drain of one twelfth transistor (TR19) is further connected to the gate of the sixth transistor (TR11) corresponding to the second register (82).

The loop filter (46) is a low-pass filter that receives and filters out the high frequency components of the control voltage (45).

The voltage controlled oscillator (VCO) (47) receives the filtered control voltage (45) from the loop filter (46) and generates an oscillating signal (48) based on the control voltage (45).

The frequency divider (49) is connected to the VCO (47) that divides the frequency of the oscillating signal (48) and then transmits the divided oscillating signal to the PFD (43) as the feedback signal (44).

Figure 9:
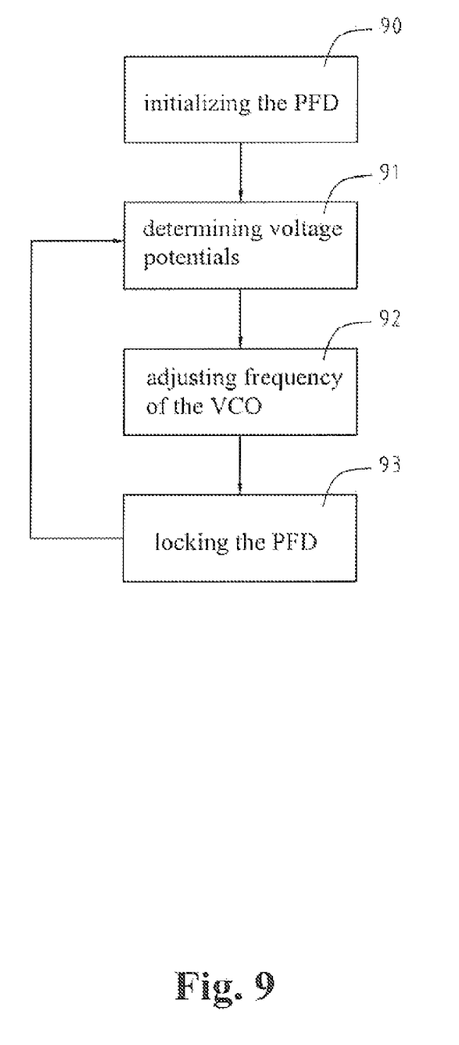
FIG. 9 is a flow diagram of a phase and frequency detection method in accordance with the present invention.

With further reference to FIG. 9, the phase and frequency detection method in accordance with present invention uses a phase-frequency detector (PFD) (43) that comprises two hysteresis buffers (50), a dominator (51) and a voltage to current converter (52) of a phase lock loop (PLL).

The phase and frequency detection method detects the voltage potential of a reference signal (42) and a feedback signal (44) to increase or decrease oscillating frequency of a VCO (47), which comprises acts of initializing the PFD (90), determining voltage potentials (91), adjusting frequency of a VCO (92) and locking the PFD (93).

The act of initializing the PFD (90) comprises setting an initial mode of the PFD (43) when the reference signal (42) and the feedback signal (44) have the same voltage potential (HIGH or LOW).

The act of determining voltage potentials (91) comprises determining whether the voltage potentials of the reference signal (42) and the feedback signal (44) are the same or not.

If the reference signal (42) and the feedback signal (44) have the same voltage potentials, the PFD (43) is locked (93).

If the reference signal (42) and the feedback signal (44) have different voltage potentials, the act of adjusting frequency of the VCO (92) is initiated to increase or decrease the frequency of the oscillating signal (48).

If the voltage potential of the reference signal (42) is higher than the voltage potential of the feedback signal (44), the PFD (43) informs the VCO (47) to increase the frequency of the oscillating signal (48).

If the voltage potential of the reference signal (42) is lower than the voltage potential of the feedback signal (44), the output of PFD (43) will make the VCO (47) to decrease the frequency of the oscillating signal (48).

The act of locking the PFD (93) disables or enables the V-I converter (52) according to the voltage of the reference signal (42), the voltage of the feedback signal (44) and the initial mode of the PFD (43).

If the voltages potentials (HIGH or LOW) of the reference signal (42) and the feedback signal (44) are similar with voltages in the initial mode of the PFD (43), the PFD (93) will enable the V-I converter (52) and continues to generate the output voltage (91).

If the voltage potentials of the reference signal (42) and the feedback signal (44) are different from those in the initial mode of the PFD (43), the PFD (93) will disable the V-I converter (52). At this time, the change of voltages of the reference and feedback signals (42, 44) will be ignored until both their voltage potentials are the same as the ones in initial mode of the PFD (43).

People skilled in the art will understand that various changes, modifications, and alterations in form and details may be made without departing from the spirit and scope of the invention.

What is claimed is:

1. A phase-locked loop (PLL) circuit comprising:
    a delay locked loop (DLL) receiving a clock signal and generating a reference signal based on the clock signal;
    a phase-frequency detector (PFD) receiving the reference signal and a feedback signal and generating a control voltage based on the difference between the received reference signal and the feedback signal, wherein the reference signal and the feedback signal are both sine waves and each signal comprises an in-phase component and an out-of-phase component;

a loop filter being a low-pass filter and filtering out high frequency components of the control voltage;

a voltage controlled oscillator (VCO) receiving the filtered control voltage from the loop filter and generating an oscillating signal based on the control voltage; and a frequency divider being connected to the VCO, dividing the frequency of the oscillating signal and then transmitting the divided oscillating signal to the PFD as the feedback signal;

wherein the PFD comprises:
two hysteresis buffers being rail-to-rail circuit structured waveform processors that respectively receiving the reference signal and the feedback signal and then convert the reference signal and the feedback signal to square waves; and a dominator generating a dominant signal based on the reference signal and the feedback signal from the hysteresis buffer;

wherein the dominator comprises:
a voltage source;
a ground;
a primary rail pair being connected to the voltage source and the ground respectively;
a dominant output terminal being connected to the primary rail pair and outputting a dominant signal;
an in-phase double rail pair comprising:
an in-phase forward rail having two ends and one end being connected to the dominant output terminal and the primary rail pair, and the other end being connected to the ground, the in-phase forward rail comprising:
a connection to the voltage source;
an in-phase reference input terminal receiving the in-phase component of the reference signal from the hysteresis buffers;
an in-phase feedback input terminal receiving the in-phase component of the feedback signal from the hysteresis buffers; and
three in-phase forward rail transistors being connected in series, each in-phase forward rail transistor comprising:
a gate, the gates of the in-phase forward rail transistors being connected respectively to the voltage source, the in-phase reference input terminal and the in-phase feedback input terminal;
an in-phase backward rail having two ends being connected to the corresponding primary rail pair and the ground, the in-phase backward rail comprising:
a connection to the ground;
an in-phase reference input terminal receiving the in-phase component of the reference signal from the hysteresis buffers;
an in-phase feedback input terminal receiving the in-phase component of the feedback signal from the hysteresis buffers; and
three in-phase backward rail transistors being connected in series, each in-phase backward rail transistor comprising:
a gate, the gates of the in-phase backward rail transistors being connected respectively to the ground, the in-phase reference input terminal and the in-phase feedback input terminal; and
a source, the source of the in-phase backward rail transistor having a gate connected to the ground is connected to the source of the in-phase backward rail transistor having a gate connected to the voltage source;

an out-of-phase double rail comprising:
an out-of-phase forward rail having two ends, one end of the out-of-phase forward rail being connected to the in-phase forward rail and the other end being connected to the ground, the out-of-phase forward rail comprising:
a connection to the voltage source;
an out-of-phase reference input terminal receiving the out-of-phase component of the reference signal from the hysteresis buffers;
an out-of-phase feedback input terminal receiving the out-of-phase component of the feedback signal from the hysteresis buffers; and
three out-of-phase forward rail transistors being connected in series, each out-of-phase forward rail transistor comprising:
a gate, the gates of the out-of-phase forward rail transistors being connected respectively to the voltage source, the out-of-phase reference input terminal and the out-of-phase feedback input terminal;
a source; and
a drain;
an out-of-phase backward rail having two ends with one end being connected to the corresponding primary rail pair and the other end being connected to the ground, the out-of-phase backward rail comprising:
a connection to the ground;
an out-of-phase reference input terminal receiving the out-of-phase component of the reference signal from the hysteresis buffers;
an out-of-phase feedback input terminal receives the out-of-phase component of the feedback signal from the hysteresis buffers; and
three out-of-phase backward rail transistors being connected in series to each other, each out-of-phase backward rail transistor comprising:
a gate, the gates of the out-of-phase backward rail transistors being connected respectively to the ground, the out-of-phase reference input terminal and the out-of-phase feedback input terminal;
a source, the source of the out-of-phase backward rail transistor with the gate connected to the ground being connected to the source of the out-of-phase forward rail transistor with the gate connected to the voltage source; and
a drain.

2. The PLL circuit as claimed in claim 1, wherein the DLL comprises:
multiple delay cells receiving the clock signal and outputting a delayed signal;
a synchronizing phase detector determining the synchronization of the delayed and non-delayed clock signal;
a synchronizing charge pump being connected to the synchronizing phase detector and generating a synchronizing control voltage based on the determination of the synchronizing phase detector;
a synchronizing loop filter being a low-pass filter, being connected to the synchronizing charge pump and the delay cells, filtering out high frequency components of the synchronizing control voltage and transmitting the filtered synchronizing control voltage to adjust the delay of the delay cells that insures the synchronization of the delayed and non-delayed clock signal; and an edge combiner extracting the clock signal in both the delayed and non-delayed state within a period, and then generating the reference signal based on the difference of the extracted delayed and non-delayed clock signals.

3. The PLL circuit as claimed in claim 2, wherein the PFD further comprises:
   a voltage to current (V-I) converter being driven by the dominant signal and generating the control voltage based on the voltage potential of the dominant signal and the frequencies of the reference signal and the feedback signal.

4. The PLL circuit as claimed in claim 1, wherein the control voltage comprises:
   a pull-up control signal to increase the oscillating frequency of the VCO; and
   a pull-down control signal to decrease the oscillating frequency of the VCO.

5. The PLL circuit as claimed in claim 1, wherein each hysteresis buffer comprises:
   a voltage source;
   multiple grounds;
   an in-phase input terminal receiving the in-phase component of the reference signal or the feedback signal;
   an out-of-phase input terminal receiving the out-of-phase component of the reference signal or the feedback signal;
   an in-phase output terminal;
   an out-of-phase output terminal;
   a pair of input transistors, each input transistor comprising:
      a gate, the gates of the input transistors being connected respectively to the in-phase input terminal and the out-of-phase input terminal;
      a source, the sources of the input transistors being connected to ground; and
      a drain;
   a pair of first transistors, each first transistor comprising:
      a source, the sources of the first transistors being connected to the voltage source;
      a gate, the gates of the first transistors being connected to ground; and
      a drain, the drains of the first transistors being connected respectively to the in-phase output terminal and the out-of-phase output terminal; and
   a pair of second transistors, each second transistor comprising:
      a drain, the drains being connected respectively to the drains of the first transistors and respectively to the corresponding in-phase output terminal and the out-of-phase output terminal;
      a source, the sources being connected to ground; and
      a gate, the gates being connected respectively to drains of the opposite first transistors.

6. The PLL circuit as claimed in claim 1, wherein the primary rail pair comprises:
   a pair of third transistors, each third transistor comprising:
      a source, the sources of the third transistors being connected to the ground;
      a gate; and
      a drain, the drains of the third transistors are connected respectively to gates of the opposite third transistor;
   a pair of fourth transistors each comprising:
      a gate, the gates of the fourth transistors being connected to the ground;
      a source, the sources of the fourth transistors being connected to the voltage source; and
      a drain, the drains of the fourth transistors being connected to the drains of the corresponding third transistors.

7. The PLL circuit as claimed in claim 3, wherein the voltage to current converter comprises:
   a voltage source;
   a ground;
   a dominant input terminal receiving the dominant signal from the dominator;
   an output terminal;
   two fifth transistors, each fifth transistor comprising:
      a gate, the gates of fifth transistors being connected respectively to the gates of the corresponding fifth transistors;
      a source, the sources of the fifth transistors being connected to the ground; and
      a drain, the drain of one fifth transistor being connected to the gates of the fifth transistors, and the drain of the other fifth transistor being connected to the output terminal;
   two sixth transistors, each sixth transistor comprising:
      a gate;
      a drain, the drain of one of the sixth transistors being connected to the drain of the corresponding fifth transistor and the output terminal, and the drain of the other sixth transistor being connected to the drain of the other fifth transistor and the gates of the fifth transistors;
      a source, the sources of the sixth transistors being connected to the voltage source; and
   a first register being connected to the dominant input terminal, the gate of the corresponding sixth transistor and the source voltage, receiving the dominant signal, the in-phase component of the reference signal and the out-of-phase component of the reference signal and comprising
      an out-of-phase reference signal input terminal receiving the out-of-phase component of the reference signal from the hysteresis buffers;
      an in-phase reference signal input terminal receiving the in-phase component of the reference signal from the hysteresis buffers;
      multiple grounds;
      an input transistor connecting to the dominant input terminal and Comprising:
         a gate being connected to the dominant input terminal;
         a source being connected to ground; and
         a drain;
      a pair of seventh transistors, each seventh transistor comprising:
         a source, the sources of the seventh transistors being connected to each other and to the drain of the input transistor;
         a gate, the gates of the seventh transistors are connected respectively to the out-of-phase reference signal input terminal and the in-phase reference signal input terminal;
      a pair of eighth transistors, each eighth transistor comprising:
         a gate, the gates of the eighth transistor being connected respectively to the drains of the opposite seventh transistors; and
         a source, the sources of the eighth transistors being connected to ground; and a drain, the drains of the eighth transistors being connected respectively to the gates of the other eighth transistors;
a pair of ninth transistors, each ninth transistor comprising:
a gate, the gates of the ninth transistors being connected to the ground;
a source, the sources of the ninth transistors being connected to the voltage source; and
a drain, the drains being connected to the drains of the corresponding seventh and eighth transistors, the drain of one ninth transistor being further connected to the gate of the sixth transistor corresponding to the first register;
a second register being connected to the dominant input terminal and the gate of the sixth transistor corresponding to the second register and the source voltage, receiving the dominant signal, the in-phase component of the feedback signal and the out-of-phase component of the feedback signal and comprising
an out-of-phase feedback signal input terminal receives the out-of-phase feedback signal from the hysteresis buffers;
an in-phase feedback signal input terminal receives the in-phase feedback signal from the hysteresis buffers;
multiple grounds;
an input transistor comprising:
a gate of the input transistor is connected to the dominant input terminal;
a source of the input transistor is connected to the ground;
a pair of tenth transistors, each tenth transistor comprising:
a source, the sources of the seventh transistors being connected to each other and the drain of the input transistor;
a drain;
a gate, the gates of the seventh transistors are connected respectively to the out-of-phase feedback signal input terminal and the in-phase feedback signal input;
a pair of eleventh transistors, each eleventh transistor comprising:
a gate, the gates of the eleventh transistor being connected respectively to the drains of the opposite eleventh transistor;
a source, the sources of the eleventh transistors being connected to ground; and
a drain, the drains of the eleventh transistors being connected respectively to the gate of the other eleventh transistor; and
a pair of twelfth transistors, each twelfth transistor comprising:
a gate, the gates of the twelfth transistors are connected to ground;
a source, the sources of the twelfth transistors are connected to the voltage source; and
a drain, the drains of the twelfth transistors being connected to the drain of the corresponding tenth and eleventh transistors, and the drain of one twelfth transistor being further connected to the gate of the sixth transistor corresponding to the second register.

8. A phase and frequency detection method using a phase-frequency detector (PFD) comprising two hysteresis buffers, a dominator and a voltage to current converter of a phase lock loop (PLL), which detects the voltage difference between a reference signal and a feedback signal to increase or decrease oscillating frequency of a VCO and comprising acts of:
providing the PFD, wherein the dominator of the PFD comprises:
a voltage source;
a ground;
a primary rail pair being connected to the voltage source and the ground respectively;
a dominant output terminal being connected to the primary rail pair and outputting a dominant signal;
an in-phase double rail pair comprising:
an in-phase forward rail having two ends and one end being connected to the dominant output terminal and the primary rail pair, and the other end being connected to the ground, the in-phase forward rail comprising:
a connection to the voltage source;
an in-phase reference input terminal receiving the in-phase component of the reference signal from the hysteresis buffers;
an in-phase feedback input terminal receiving the in-phase component of the feedback signal from the hysteresis buffers; and
three in-phase forward rail transistors being connected in series, each in-phase forward rail transistor comprising:
a gate, the gates of the in-phase forward rail transistors being connected respectively to the voltage source, the in-phase reference input terminal and the in-phase feedback input terminal;
an in-phase backward rail having two ends being connected to the corresponding primary rail pair and the ground, the in-phase backward rail comprising:
a connection to the ground;
an in-phase reference input terminal receiving the in-phase component of the reference signal from the hysteresis buffers;
an in-phase feedback input terminal receiving the in-phase component of the feedback signal from the hysteresis buffers; and
three in-phase backward rail transistors being connected in series, each in-phase backward rail transistor comprising:
a gate, the gates of the in-phase backward rail transistors being connected respectively to the ground, the in-phase reference input terminal and the in-phase feedback input terminal; and
a source, the source of the in-phase backward rail transistor having a gate connected to the ground is connected to the source of the in-phase backward rail transistor having a gate connected to the voltage source;
an out-of-phase double rail comprising:
an out-of-phase forward rail having two ends, one end of the out-of-phase forward rail being connected to the in-phase forward rail and the other end being connected to the ground, the out-of-phase forward rail comprising:
a connection to the voltage source;
an out-of-phase reference input terminal receiving the out-of-phase component of the reference signal from the hysteresis buffers;
an out-of-phase feedback input terminal receiving the out-of-phase component of the feedback signal from the hysteresis buffers; and three out-of-phase forward rail transistors being connected in series, each out-of-phase forward rail transistor comprising:
  a gate, the gates of the out-of-phase forward rail transistors being connected respectively to the voltage source, the out-of-phase reference input terminal and the out-of-phase feedback input terminal;
  a source; and
  a drain;
an out-of-phase backward rail having two ends with one end being connected to the corresponding primary rail pair and the other end being connected to the ground, the out-of-phase backward rail comprising:
  a connection to the ground;
  an out-of-phase reference input terminal receiving the out-of-phase component of the reference signal from the hysteresis buffers;
  an out-of-phase feedback input terminal receives the out-of-phase component of the feedback signal from the hysteresis buffers; and
  three out-of-phase backward rail transistors being connected in series to each other, each out-of-phase backward rail transistor comprising:
    a gate, the gates of the out-of-phase backward rail transistors being connected respectively to the ground, the out-of-phase reference input terminal and the out-of-phase feedback input terminal;
    a source, the source of the out-of-phase backward rail transistor with the gate connected to the ground being connected to the source of the out-of-phase forward rail transistor with the gate connected to the voltage source; and
    a drain;
initializing the PFD comprising setting an initial mode of the PFD when the reference signal and the feedback signal (44) having the same voltage potential;
determining voltage potentials comprising determining whether the voltage potentials of the reference signal and the feedback signal are the same or not;
adjusting the frequency of a VCO to increase or decrease the frequency of a oscillating signal until the voltage potentials of the reference and feedback signals are the same as the initial mode of the PFD; and
locking the PFD disables or enables the V-I converter according to the voltage of the reference signal, the voltage of the feedback signal and the initial mode of the PFD.

9. The phase and frequency detection method as claimed in claim 8, wherein the PFD locks when the reference signal and the feedback signal have the same voltage potentials.

10. The phase and frequency detection method as claimed in claim 9, the act of locking the PFD that enables the V-I converter and returns to the act of determining the voltage potentials when voltage potentials of the reference signal and the feedback signal are the same as the initial mode of the PFD.

11. The phase and frequency detection method as claimed in claim 9, the act of locking the PFD that disables the V-I converter and the changes of voltage potentials of the reference and feedback signals will be ignored until both voltage potentials are the same as the initial mode of the PFD.

* * * * *